United States Patent [19]

Meiners

[11] 4,268,844
[45] May 19, 1981

[54] INSULATED GATE FIELD-EFFECT TRANSISTORS

[75] Inventor: Larry G. Meiners, San Diego, Calif.

[73] Assignee: The United States of America as represented by the Secretary of the Navy, Washington, D.C.

[21] Appl. No.: 109,011

[22] Filed: Dec. 31, 1979

[51] Int. Cl.³ .......................................... H01L 29/78
[52] U.S. Cl. ........................................ 357/23; 357/4; 357/30; 357/67; 357/58
[58] Field of Search ................... 357/23, 30, 67, 4, 58

[56] References Cited

U.S. PATENT DOCUMENTS

| | | | |
|---|---|---|---|
| 3,354,365 | 11/1967 | Belasco | 317/237 |
| 4,111,725 | 9/1978 | Cho et al. | 148/175 |
| 4,115,914 | 9/1978 | Harari | 29/571 |
| 4,161,739 | 7/1979 | Messick | 357/23 |

Primary Examiner—Martin H. Edlow
Attorney, Agent, or Firm—Richard S. Sciascia; Ervin F. Johnston; Thomas M. Phillips

[57] ABSTRACT

An improved normally off insulated gate field-effect transistor capable of operation at frequencies in excess of 1 GHz wherein the substrate is a semi-insulating semiconductor. The substrate may be Fe or Cr doped InP or Fe or Cr-doped GaAs. Contacts for the source and drain electrodes are realized by forming n+contacts for the n-channel device and p+contacts for the p-channel device. Au-Sn will form n+contacts while Au-Zn will form p+contacts.

23 Claims, 2 Drawing Figures

INSULATED GATE FIELD-EFFECT TRANSISTORS

BACKGROUND OF THE INVENTION

It has been previously demonstrated that n-channel inversion layers may be formed on the surface of p-type InP as disclosed in the U.S. patent application of David A. Collins et al., for NORMALLY OFF InP FIELD EFFECT TRANSISTOR, Ser. No. 72,399, filed Sept. 4, 1979. As disclosed by Collins et al., metal-insulator-semiconductor field-effect transistors (MISFET) utilizing these layers have been fabricated which exhibit normally off behavior with essentially constant gain from d. c. to 1 MHz. The device disclosed by Collins et al., was constructed on a 100-oriented p-type bulk substrate with a carrier density approximately $10 \times 10^{16}$ centimeter$^{-3}$. Although demonstrating the potential of this device, it is believed that the high carrier density of this material results in large parasitic capacitances between the source, drain, and gate contact pads and the substrate which in turn severely limits the utility of the device by precluding the possibility of microwave power gain.

SUMMARY OF THE INVENTION

The present invention provides for an improved normally off accumulation mode metal-insulator gate field-effect transistor (MISFET) on semi-insulating semiconductor bulk material. The substrate may be Fe or Cr-doped InP or Fe- or Cr-doped GaAs. Contacts for the source and drain electrodes are realized by forming n+ contacts for the n-channel device and p+ contacts for the p-channel device. Au-Sn will form n+ contacts while Au-Zn will form p+ contacts. As an alternate to the Au-Sn source-drain contact pads 12 and 14, the regions could be formed by diffusion of silicon, sulfur, or tin into the bulk material or by the growth of an n-type epilayer and subsequent etching out of the contact areas. A device made in accordance with the teachings of the invention will operate at frequencies in excess of 1 GHz.

OBJECTS OF THE INVENTION

An object of the invention is the provision of a field-effect transistor capable of operation at frequencies in excess of 1 GHz.

Another object of the invention is the provision of a field-effect transistors capable of operating at frequencies in excess of 1 GHz that remains in the fully-off state with no bias applied and in the on state when gate bias is applied.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
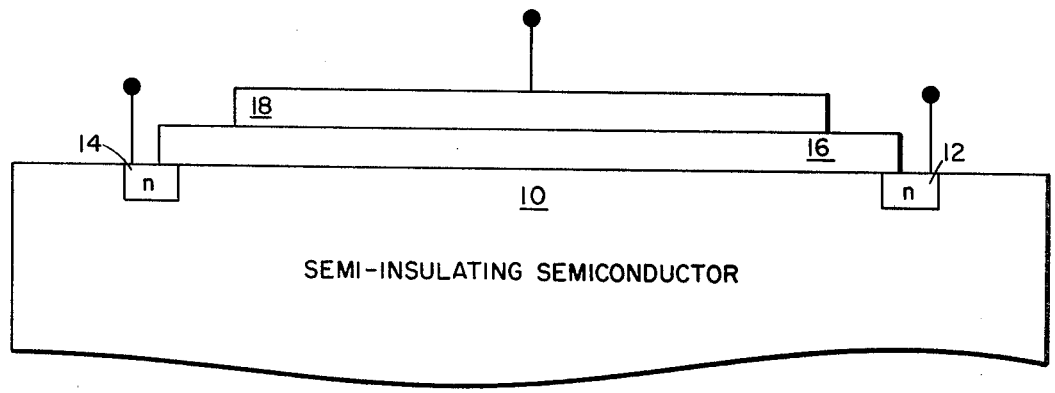
FIG. 1 is a cross-sectional view of the transistor made in accordance with the invention.

Referring now to the drawings, there are shown insulated gate field-effect transistors made in accordance with the teachings of the invention. As shown, the drawings are not necessarily to scale and in some cases are distorted for purposes of clarity.

The device 10 shown in FIG. 1 is fabricated on (100) oriented iron-doped bulk material 10 obtained commercially with a carrier density $\sim 1 \times 10^8$ cm$^{-3}$ and an electron mobility $\sim 3000$ cm$^2$/V-sec as determined by Van der Pauw Hall measurement at room temperature. The source and drain contacts 12 and 14, respectively, were deposited using vacuum evaporation and standard photolithography and lift-off. Contacts 12 and 14 are deposited on the substrate surface 11 by the evaporation of 80 w/O Au-20 w/O Sn mixture. These contacts were then annealed at 325° C. for 3 hours both to improve adhesion as well as to cause their alloying and diffusion into the substrate. Contacts prepared in this manner exhibit rectifying characteristics with no detectable conduction on a curve tracer ($<1$ $\mu$A current) until reverse breakdown is reached at between 20 and 50 volts. Following contact anneal, a layer 16 of pyrolytic SiO$_2$ was grown on the bulk semi-insulating material pyrolitically to between 1000Å and 2000Å thickness at $\sim 300°$ C. in the manner described by L. Messick, in U.S. Pat. No. 4,161,739.

Openings in the SiO$_2$ layer 16 over the source and drain contacts are then etched using standard photolithography and dry plasma etching. This is done to permit the subsequent attaching of electrical leads. The device was completed by the evaporation of an aluminum gate electrode 18 between source contact 12 and drain contact 14.

Figure 2:
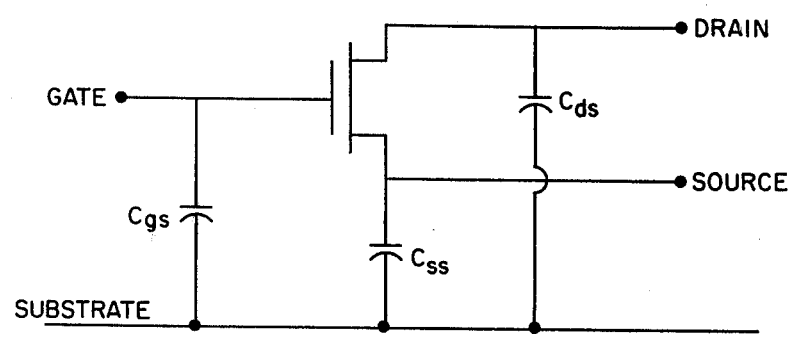
FIG. 2 is an equivalent electrical circuit of the device of FIG. 1 used to explain the improved properties of devices made in accordance with the teachings of the invention.

Referring to equivalent electrical circuit in FIG. 2, the stray capacitances associated with the structure of FIG. 1 are shown schematically. As can be seen the capacities between gate and substrate (Cgs), source and substrate (Css) and drain and substrate (Cds) would become low impedance paths at the higher frequencies. By making the device of FIG. 1 using a semi-insulating material with extremely low carrier densities for the substrate the impedance of Cgs, Css and Cds will remain high and the frequency response will be improved over devices using the conventional p-type substrates.

Semi-insulating semiconductor substrate 10 may be Fe-doped InP, chromium doped InP, chromium doped GaAs or Fe-doped GaAs.

Obviously, many other modifications and variations of the present invention are possible in the light of the above teachings. It is therefore to be understood that within the scope of the appended claims the invention may be practiced otherwise than as specifically described.

What is claimed is:

1. A normally off, insulated-gate field-effect transistor having low parasitic capacitances, comprising:
   a semi-insulating semiconductor substrate;
   a source contact and a drain contact spaced apart and disposed on said substrate;
   a dielectric layer disposed over said substrate to completely span the space between said source and drain contacts; and
   a gate electrode disposed on said dielectric layer to completely span the space between said source and drain contacts;
   whereby, charge carriers are induced electrically into the space of the semi-insulating substrate between said source and drain contacts by the application of an appropriate voltage to said gate electrode.

2. The insulated gate field-effect transistor of claim 1 wherein said substrate is single crystal semi-insulating semiconducting InP.

3. The insulated gate field-effect transistor of claim 1 wherein said substrate is single crystal semi-insulating Fe-doped InP.

4. The insulated gate field-effect transistor of claim 1 wherein said substrate is single crystal semi-insulating Cr-doped InP.

5. The insulated gate field-effect transistor of claim 1 wherein said source and drain contacts are Au-Sn.

6. The insulated gate field-effect transistor of claim 1 wherein said source and drain contacts are Au-Zn.

7. The insulated gate field-effect transistor of claim 1 wherein said substrate is single crystal semi-insulating semiconducting GaAs.

8. The insulated gate field-effect transistor of claim 1 wherein said substrate is single crystal semi-insulating Fe doped GaAs.

9. The insulated gate field-effect transistor of claim 1 wherein said substrate is single crystal semi-insulating Cr-doped GaAs.

10. The insulated gate field-effect transistor of claim 2 wherein said source and drain contacts are Au-Sn.

11. The insulated gate field-effect transistor of claim 2 wherein said source and drain contacts are Au-Zn.

12. The insulated gate field-effect transistor of claim 3 wherein said source and drain contacts are Au-Sn.

13. The insulated gate field-effect transistor of claim 3 wherein said source and drain contacts are Au-Zn.

14. The insulated gate field-effect transistor of claim 4 wherein said source and drain contacts are Au-Sn.

15. The insulated gate field-effect transistor of claim 4 wherein said source and drain contacts are Au-Zn.

16. The insulated gate field-effect transistor of claim 7 wherein said source and drain contacts are Au-Sn.

17. The insulated gate field-effect transistor of claim 7 wherein said source and drain contacts are Au-Zn.

18. The insulated gate field-effect transistor of claim 8 wherein said source and drain contacts are Au-Sn.

19. The insulated gate field-effect transistor of claim 8 wherein said source and drain contacts are Au-Zn.

20. The insulated gate field-effect transistor of claim 9 wherein said source and drain contacts are Au-Sn.

21. The insulated gate field-effect transistor of claim 9 wherein said source and drain contacts are Au-Zn.

22. The insulated gate field-effect transistor of claim 1 wherein said dielectric layer is silicon dioxide.

23. The insulated gate field-effect transistor of claim 1 wherein said dielectric layer is silicon nitride.

* * * * *